United States Patent [19]

Nishioka et al.

[11] Patent Number: 5,554,564
[45] Date of Patent: Sep. 10, 1996

[54] PRE-OXIDIZING HIGH-DIELECTRIC-CONSTANT MATERIAL ELECTRODES

[75] Inventors: Yasushiro Nishioka, Tsukuba, Japan; Scott R. Summerfelt, Dallas, Tex.; Kyung-ho Park; Pijush Bhattacharya, both of Tsukuba, Japan

[73] Assignee: Texas Instruments Incorporated, Dallas, Tex.

[21] Appl. No.: 283,467

[22] Filed: Aug. 1, 1994

[51] Int. Cl.$^6$ .................................................. H01L 21/28
[52] U.S. Cl. .......................... 437/192; 437/190; 437/201; 437/60; 437/919
[58] Field of Search ............................... 437/52, 60, 190, 437/192, 201, 919; 148/DIG. 14, DIG. 117; 257/306, 310

[56] References Cited

U.S. PATENT DOCUMENTS

| | | | |
|---|---|---|---|
| 4,809,225 | 8/1989 | Dimmler et al. | 365/145 |
| 4,888,733 | 12/1989 | Mobley | 365/145 |
| 4,893,272 | 1/1990 | Eaton, Jr. et al. | 365/145 |
| 4,910,708 | 3/1990 | Eaton, Jr. et al. | 365/145 |
| 4,914,627 | 4/1990 | Eaton, Jr. et al. | 365/145 |
| 4,918,654 | 4/1990 | Eaton, Jr. et al. | 365/145 |
| 4,982,309 | 1/1991 | Shepherd | 361/321 |
| 5,053,917 | 10/1991 | Miyasaka et al. | 361/321 |
| 5,079,200 | 1/1992 | Jackson | 501/136 |
| 5,122,923 | 6/1992 | Matsubara et al. | 361/321 |
| 5,191,510 | 3/1993 | Huffman | 361/313 |
| 5,358,889 | 10/1994 | Emesh et al. | 437/919 |

FOREIGN PATENT DOCUMENTS

0557937A1  2/1993  European Pat. Off. .... H01L 21/3205

OTHER PUBLICATIONS

G. F. McLane, L. Casas, J. S. Reid, E. Kolawa, and M.-A. Nicolet, "Reactive Ion Etching of Ta–Si–N Diffusion Barrier Material in $CF_4+O_2$." *Journal of Vacuum Science and Technology B*, vol. 12, No. 4, Jul./Aug. 1994, pp. 2352–2355, from the 1994 MRS spring mtg.

A. F. Tasch, Jr. and L. H. Parker, "Memory Cell and Technology Issues for 64 and 256–Mbit One–Transistor Cell MOS DRAMs," *Proceedings of the IEEE*, vol. 77, No. 3, Mar. 1989, pp. 374–388.

K. Takemura, et al., "Barrier Mechanism of Pt/Ta and Pt/Ti Layers for $SrTiO_3$ Thin Film Capacitors on Si," *4th Inter. Symp. on Integrated Ferroelectrics*, C52 (1992).

T. Sakuma, S. Yamamichi, S. Matsubara, H. Yamguchi, and Y. Miyasaka, "Barrier Layers for Realization of High Capacitance Density in $SrTiO_3$ Thin–Film Capacitor on Silicon," *Appl. Phys. Lett.*, 57 (23) 3 Dec. 1990, pp. 2431–2433.

M.– A. Nicolet, "Diffusion Barriers in Thin Films," *Thin Solid Films*, 52 (1978) 415–443.

M.– A. Nicolet, "Thin Film Diffusion Barrier for Metal–Semiconductor Contacts," *Materials Research Society*, 1987, pp. 19–26.

(List continued on next page.)

Primary Examiner—George Fourson
Assistant Examiner—Thomas G. Bilodeau
Attorney, Agent, or Firm—Bret J. Petersen; Brian A. Carlson; Richard L. Donaldson

[57] ABSTRACT

An improved method of forming a capacitor electrode for a microelectronic structure such as a dynamic read only memory is disclosed which has a high dielectric constant (HDC) material as a capacitor dielectric. According to an embodiment of the present invention, the sidewall of the adhesion layer (e.g. TiN 36) in a lower electrode is pre-oxidized after deposition of an unreactive noble metal layer (e.g. Pt 38) but before deposition of an HDC material (e.g. BST 42). An important aspect of the present invention is that the pre-oxidation of the sidewall generally causes a substantial amount of the potential sidewall expansion (and consequent noble metal layer deformation) to occur before deposition of the HDC material.

21 Claims, 3 Drawing Sheets

OTHER PUBLICATIONS

C. J. Brennan, "Characterization and Modelling of Thin-Film Ferroelectric Capacitors Using C–V Analysis," *Proc. 3rd Inter. Symp. on Integrated Ferroelectrics*, 354–363 (1991).

J. F. Scott, B. M. Melnick, C. A. Araujo, L. D. McMillan and R. Zuleeg, "D.C. Leakage Currents in Ferroelectric Memories," *Proc. 3rd Inter. Symp. on Integrated Ferroelectrics*, 176–184 (1991).

R. Waser and M. Klee, "Theory of Conduction and Breakdown in Perovskite Thin Films," *Proc. 3rd Inter. Symp. on Integrated Ferroelectrics*, 288–305 (1991).

P. D. Hren, H. N. Al–Shareef, S. H. Rou, A. I. Kingon, P. Buaud, and E. A. Irene, "Hillock Formation in Pt Films," *Proc. MRS*, 1992.

H. N. Al–Shareef, K. D. Gifford, P. D. Hren, S. H. Rou, O. Auciello, and A. I. Kingon, "Bottom Electrodes for Ferroelectric Thin Films," 1992.

S. Saito and K. Kuramasu, "Plasma Etching of $RuO_2$ Thin Films," *Japn. J. Appl. Phys.*, vol. 31, 1992, pp. 135–138.

S. K. Dey and R. Zuleeg, "Processing and Parameters of Sol–Gel PZt Thin–Films for GaAs Memory Applications," *Ferroelectrics*, vol. 112, 1990, pp. 309–319.

C. Hanson, H. Beratan, R. Owen, M. Corbin, and S. McKenney, "Uncooled Thermal Imaging at Texas Instruments," *SPIE*, 1735, 17 (1992).

B. Kulwicki, A. Amin, H. R. Beratan, and C. M. Hanson, "Pyroelectric Imaging," *ISAF*, 92, (1992).

D. L. Polla, C.– P. Ye and T. Yamagawa, "Surface–Micromachined $PbTiO_3$ Pyroelectric Detectors," *Appl. Phys. Lett.* 59, 1991, pp. 3539–3541.

K. R. Bellur, H. N. Al–Shareef, S. H. Rou, K. D. Gifford, O. Auciello, and A. I. Kingon, "Electrical Characterization of Sol–Gel Derived PZT Thin Films," 1992.

S. D. Bernstein, T. Y. Wong, Y. Kisler, and R. W. Tustison, "Fatigue of Ferroelectric $PbZr_xTi_yO_3$ Capacitors with Ru and $RuO_x$ Electrodes," *J. Mat. Res.*, 8, 1993, pp. 12–13.

P. D. Hren, S. H. Rou, H. N. Al–Shareef, M. S. Ameen, O. Auciello, and A. I. Kingon, "Bottom Electrodes for Integrated Pb(Zr,Ti)$O_3$ Films," *Integrated Ferroelectrics*, vol. 2, No. 1–4, 1992.

K. Char, M. S. Colclough, T. H. Geballe, and K. E. Myers, "High T Superconductor–Normal–Superconductor Josephson Junctions Using $CaRuO_3$ as the Metallic Barrier," *Appl. Phys. Lett.*, 62, 1993, pp. 196–198.

Yasushiro Nishioka et al., "Time Dependent, Dielectric Breakdown Characteristics of $Ta_2O_5/SiO_2$ Double Layers," *Journal of the Electrochemical Society*, vol., 136, No. 3, Mar. 1989, pp. 872–873.

H. Jehn et al., "Surface and Interface Characterization of Heat–Treated (Ti,Al)N Coatings on High Speed Steel Substrates," *Thin Solid Films*, 153 (1987) 45–53.

Shigeaki Zaima et al., "Conduction Mechanism of Leakage Current in $Ta_2O_5$ Films on Si Prepared by LPCVD," *Journal of the Electrochemical Society*, vol. 137, No. 9, Sep. 1990, pp. 2876–2879.

Yasushiro Nishioka et al., "Influence of $SiO_2$ at the $Ta_2O_5/Si$ Interface on Dielectric Characteristics of $Ta_2O_5$ Capacitors," *Journal of Applied Phyiscs*, 61(6), Mar. 15, 1987, pp. 2335–2338.

Shigeaki Zaima et al., "Preparation and Properties of $Ta_2O_5$ Films by LPCVD for ULSI Application," *Journal of the Electrochemical Society*, vol. 137, No. 4, Apr. 1990, pp. 1297–13000.

G. Arlt et al., "Dielectric Properties of Fine–Grained Barium Titanate Ceramics," *Journal of Applied Physics*, 58(4), Aug. 15, 1985, pp. 1619–1625.

Yoichi Miyaskai et al., "Dielectric Properties of Sputter–Deposited $BaTiO_3$–$SrTiO_3$ Thin Films," *19990 IEEE 7th International Symposium on Applications of Ferroelectrics*, IEEE (1991), pp. 121–124.

Q. X. Jia et al., "Reactively Sputtered $RuO_2$ Thin Film Resistor With Near Zero Temperature Coefficient of Resistance," *Thin Solid Films*, 196 (1991) pp. 29–34.

T. Elmori, et al., "A Newly Designed Planar Stacked Capacitor Cell with High Dielectric Constant Film for 256 Mbit DRAM," *IEEE*, Dec. 5–8, 1993.

J. M. Molarius et al., "Tantalum–Based Encapsulants for Thermal Annealing of GaAs," *Journal of the Electrochemical Society*, vol. 138, No. 3, Mar. 1991, pp. 834–837.

H. Ichimura et al., "High–Temperature Oxidation of Ion–Plated TiN and TiAlN Films," *J. Mater. Res.*, vol. 8, No. 5, May 1993, pp. 1093–1100.

E. Kolawa et al., "Amorphous Ta–Si–N Thin Films Alloys as Diffusion Barrier in Al/Si," *J. Vac. Sci. Technol.*, A 8 (3), May/Jun. 1990, pp. 3006–3010.

M.– A. Nicolet et al., "Issues in Metal/Semiconductor Contact Design and Implementation," *Solar Cells*, 27 (1989) 177–189.

P. J. Pokela et al., "Charcterization of the AL/Ta–Si–N/Au Metallization," *Thin Solid Films*, 203 (1991) 259–266.

L. E. Halperin, "Silicon Schottky Barriers and p–n Junctions with Highly Stable Aluminum Contact Metallization," *IEEE Electron Device Letters*, vol. 12, No. 6, Jun. 1991, pp. 309–311.

E. Kolawa, "Sputtered Ta–Si–N Diffusion Barriers in Cu Metalizations for Si," *IEEE Electron Device Letters*, vol. 12, No. 6, Jun. 1991, pp. 321–323.

P. J. Pokela et al., "Amorphous Ternary Ta–Si–N Diffusion Barrier Between Si and Au," *J. Electrochem. Soc.*, vol. 138, No. 7, Jul. 1991, pp. 2125–2129.

E. Kolawa et al., "Amorphous Ternary Ta–Si–N Diffusion Barriers in Si/Al and Si/Cu Metallizations," *Applied Surface Science*, 53 (1991) 373–376.

P. J. Pokela et al., "Thermal Oxidation of Amorphous Ternary $Ta_{36}Si_{14}N_{50}$ Thin Films," *J. Appl. Phys.*, 70(5), 1 Sep. 1991, pp. 2828–2832.

J. S. Reid et al., "Evaluation of Amorphous (Mo, Ta, W)–Si–N Diffusion Barriers for <Si>/Cu Metallizations," *Thin Solid Films*, 236 (1993) 319–324.

J. S. Chen et al., "Stable Pt/Ge/Au Ohmic Contact to n–GaAs with a Ta–Si–N Barrier," *Mat. Res. Soc. Symp. Proc.*, Vol. 300, 1993, pp. 255–260.

J. S. Reid et al., "Ti–Si–N Diffusion Barriers Between Silicon and Copper," *IEEE Electron Device Letters*, vol. 15, No. 8, 1994, pp. 298–300.

PRE-OXIDIZING HIGH-DIELECTRIC-CONSTANT MATERIAL ELECTRODES

CROSS-REFERENCES TO RELATED APPLICATIONS

The following related applications were filed concurrently with the instant application.

| Title | Inventors | Serial Number |
|---|---|---|
| Improved High-Dielectric-Constant Material Electrodes Comprising Thin Platinum Layers | Summerfelt, Beratan, Kirlin, Gnade | 08/283.881 |
| Improved Electrodes Comprising Conductive Perovskite-Seed Layers for Perovskite Dielectrics | Summerfelt, Beratan | 08/283,468, |
| Improved High-Dielectric-Constant Material Electrodes Comprising Thin Ruthenium Dioxide Layers | Summerfelt, Beratan, Kirlin, Gnade | 08/283,442, abandoned |
| High-Dielectric-Constant Material Electrodes Comprising Sidewall Spacers | Nishioka, Park, Bhattacharya, Summerfelt | 08/283,871 now U.S. Pat. No. 5,489,548 |
| A Conductive Amorphous-Nitride Barrier Layer for High-Dielectric-Constant Material Electrodes | Summerfelt | 08/283,441 |
| A Conductive Exotic-Nitride Barrier Layer for High-Dielectric-Constant Material Electrodes | Summerfelt | 08/283,873 now U.S. Pat. No. 5,504,041 |
| A Conductive Noble-Metal-Insulator-Alloy Barrier Layer for High-Dielectric-Constant Material Electrodes | Summerfelt, Nicolet, Reid, Kolawa | 08/283,454 |

The following previously filed applications are related to the instant application:

| Title | Inventors | Docket/Serial Number |
|---|---|---|
| Improved Electrical Connections to Dielectric Materials | Gnade, Summerfelt | 08/009,521 now U.S. Pat. No. 5,348,894 |
| Improved Electrical Connections to Dielectric Materials | Gnade, Summerfelt | 08/260,149, abandoned |
| Lightly Donor Doped Electrodes for High-Dielectric-Constant Materials | Summerfelt, Beratan, Gnade | 08/040,946, abandoned |
| Lightly Donor Doped Electrodes for High-Dielectric-Constant Materials | Summerfelt, Beratan, Gnade | 08/276,191, abandoned |
| Improved Electrode Interface for High-Dielectric-Constant Materials | Summerfelt, Beratan | 08/041,025 now U.S. Pat. No. 5,471,364 |

FIELD OF THE INVENTION

This invention generally relates to improving electrical connections to materials with high-dielectric-constants, such as in the construction of capacitors.

BACKGROUND OF THE INVENTION

Without limiting the scope of the invention, its background is described in connection with current methods of forming electrical connections to high-dielectric-constant materials, as an example.

The increasing density of integrated circuits (e.g. DRAMs) is increasing the need for materials with high-dielectric-constants to be used in electrical devices such as capacitors. Generally, capacitance is directly related to the surface area of the electrode in contact with the capacitor dielectric, but is not significantly affected by the electrode volume. The current method generally utilized to achieve higher capacitance per unit area is to increase the surface area/unit area by increasing the topography, such as in trench and stack capacitors using $SiO_2$ or $SiO_2/Si_3N_4$ as the dielectric. This approach becomes very difficult in terms of manufacturability for devices such as the 256 Mbit and 1 Gbit DRAMs.

An alternative approach is to use a high permittivity dielectric material. Many perovskite, ferroelectric, or high-dielectric-constant (hereafter abbreviated HDC) materials such as $(Ba,Sr)TiO_3$ (BST) usually have much larger capacitance densities than standard $SiO_2$-$Si_3N_4$-$SiO_2$ capacitors. Various metals and metallic compounds, and typically noble metals such as Pt and conductive oxides such as $RuO_2$, have been proposed as the electrodes for these HDC materials. To be useful in electronic devices, however, reliable electrical connections should generally be constructed which do not diminish the beneficial properties of these high-dielectric-constant materials.

SUMMARY OF THE INVENTION

As used herein, the term "high-dielectric-constant" means a dielectric constant greater than about 50 at device operating temperature. The deposition of an HDC material usually occurs at high temperature (generally greater than about 500° C.) in an oxygen containing atmosphere. Many electrode materials oxidize and become insulating or otherwise degrade in this type of environment. An initial electrode structure formed prior to the HDC material deposition should be stable both during and after this deposition, while subsequent electrode structures formed after this deposition need only be stable after this deposition.

As mentioned hereinabove, Pt has been suggested for the electrodes of an HDC material layer in standard thin-film (herein defined as generally less than 5 microns (um)) applications. However, although Pt is unreactive with respect to the HDC material, it has been found that it is difficult to use Pt alone as an initial electrode. Pt generally allows oxygen to diffuse through it and hence typically allows neighboring materials to oxidize. In addition, Pt also does not normally stick very well to traditional dielectrics such as $SiO_2$ or $Si_3N_4$, and Pt can rapidly form a silicide at low temperatures. Thus a Ta or TiN layer has been suggested as an adhesion or buffer layer under the Pt electrode. However, during BST deposition or annealing, oxygen can possibly diffuse through the Pt and oxidize the adhesion layer and make the adhesion layer less conductive. This may be more of a problem on the sides of the adhesion layer than on the top horizontal surface, since the Pt will generally be thicker on the top, and a better diffusion barrier..

Conductive oxides such as $RuO_2$ have also been suggested for the electrodes of an HDC material layer in standard thin-film applications. Again, although $RuO_2$ is unreactive with respect to the HDC material, it too generally has difficulties. For example, the electrical properties of the structures formed using these oxides are usually inferior to those formed using e.g. Pt. Many thin-film applications require a small leakage-current-density in addition to a large capacitance per unit area. The leakage current is sensitive to many variables such as thickness, microstructure, electrodes, electrode geometry and composition. For example, the leakage current of lead zirconium titanate (PZT) using $RuO_2$ electrodes is several orders of magnitude larger than the leakage current of PZT using Pt electrodes. In particular, it appears that the leakage current is controlled by Schottky barriers, and that the smaller leakage current with Pt electrodes appears to be due to the larger work function.

As used herein, the term "unreactive", when used in reference to a material contacting an HDC material, means a material which provides a stable conductive interface to the HDC material during and after processing. Note that when a conductive oxide such as $RuO_2$ is used for the unreactive layer (or another part of the electrode), that layer can also contain unoxidized or partially oxidized Ru. For example, an unreactive layer of Ru which is chemically changed by becoming partially or fully oxidized during the HDC deposition process is still considered unreactive since it still provides a stable conductive interface to the HDC material.

Other structures which have been proposed for standard thin-film structures include alloys of Pt, Pd, Rh as the electrode and oxides made of Re, Os, Rh and Ir as a sticking layer on single crystal Si or poly-Si. A problem with these electrodes is that these oxides are usually not stable next to Si and that these metals typically rapidly form silicides at low temperatures (generally less than about 450° C.). If other associated problems can be avoided or minimized, this type of electrode structure should retain its conductivity even after the deposition of the HDC material if an appropriate adhesion (barrier) layer(s) is used between the conductive oxide and the Si substrate.

Thus many of the proposed lower electrode structures comprise the following generic layers: HDC material/unreactive (oxygen stable) layer/adhesion (barrier) layer/substrate. In these structures, the adhesion layer typically comprises a conductive material that will oxidize under HDC material deposition conditions to provide a conductive oxide. It has been discovered that expansion stress and crack formation in the HDC material can occur due to the oxidizing and consequent expanding of the adhesion layer during HDC material deposition.

Although this oxidation/expansion can generally occur at any surface of the adhesion layer, oxidation of the top of the adhesion layer is substantially impeded by the overlying unreactive layer, and oxidation of the bottom of the adhesion layer is substantially impeded by the material surrounding it (e.g. the substrate). Generally, an exposed sidewall would be the most likely surface of the adhesion layer to be oxidized. Since most materials proposed for the adhesion layer experience a volume change when oxidized, the adhesion layer sidewall generally expands and deforms the overlying unreactive layer and causes stress and cracking of the HDC material layer. These cracks can reach from the upper surface of the HDC material layer down to the lower electrode, with detrimental results. For example, if a conductive layer, such as an upper electrode for a capacitor, is deposited on the HDC layer, the capacitor can have substantial leakage or even be shorted between the two electrodes.

Generally, according to the present invention, the sidewall of the adhesion layer is pre-oxidized before deposition of the HDC material (but after deposition of an unreactive noble metal layer). An important aspect of the present invention is that the pre-oxidation of the sidewall generally causes a substantial amount of the potential sidewall expansion (and consequent noble metal layer deformation) to occur before deposition of the HDC material. Potential sidewall expansion is defined as the total amount of expansion that occurs through HDC deposition and annealing (with or without pre-oxidation).

According to the present invention, the sidewall of the adhesion layer is substantially oxidized before HDC deposition. In contrast to the present invention, superficial oxidation (e.g. forming a few monolayers of oxide) at various stages of fabrication of a ferroelectric capacitor has apparently been described in the prior art. See European Patent Application 557,937 A1, D. Patel et al., Ramtron International Corp., filed Feb. 23, 1993. The oxidation described by D. Patel et al. is superficial and is apparently in a different portion of the structure and for a different purpose, i.e., better adhesion to the bottom glass layer and to the top ferroelectric material, than the present invention. The adhesion layer sidewall of the present invention must generally be more than merely superficially oxidized, since a superficially oxidized adhesion layer would generally still undergo substantial oxidation and expansion during HDC deposition, to the detriment of the structure.

One embodiment of the present invention is a microelectronic structure comprising a supporting layer having a principal surface, and an adhesion layer overlying the principal surface of the supporting layer, wherein the adhesion layer comprises a top surface and an expanded, oxidized sidewall. The structure further comprises a noble metal layer overlying the top surface of the adhesion layer, wherein the noble metal layer comprises a deformed area overlying the oxidized sidewall, and a high-dielectric-constant material layer overlying the noble metal layer. The high-dielectric-constant material layer is substantially free of expansion stress cracks in proximity to the deformed area of the noble metal layer.

A method of forming an embodiment of the present invention comprises forming a supporting layer having a principal surface, forming an adhesion layer on the principal surface of the supporting layer, and forming a noble metal layer on a top surface of the adhesion layer, wherein the adhesion layer comprises a substantially unoxidized sidewall. The method further comprises oxidizing the unoxidized sidewall of the adhesion layer to form a pre-oxidized sidewall, and depositing a high-dielectric-constant material layer on the noble metal layer. The preoxidized sidewall minimizes further oxidation and expansion of the adhesion layer adjacent the pre-oxidized sidewall. Expansion stress and cracking of the high-dielectric-constant material layer is minimized during the step of depositing the high-dielectric-constant material layer.

These are apparently the first microelectronic structures wherein an electrode to an HDC material comprises an adhesion layer with a pre-oxidized sidewall which impedes the adhesion layer from undergoing substantial oxidation and expansion during HDC material deposition. These structures may also be used for multilayer capacitors and other thin-film devices such as pyroelectric devices (e.g. (uncooled) infrared detectors), non-volatile ferroelectric RAMs (using permanent polarization properties), thin-film piezoelectric and thin-film electro-optic devices.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
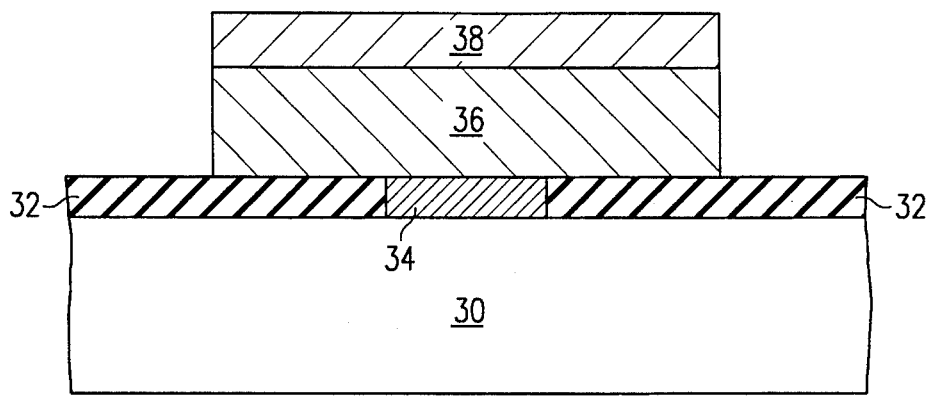
FIGS. 1–4 are cross-sectional views showing the progressive steps in the fabrication of a high-dielectric constant material capacitor with an electrode comprising a non-conductive, pre-oxidized sidewall.

With reference to FIGS. 1–4, –here is shown a method of forming an embodiment of the present invention, a lower electrode structure comprising a preoxidized sidewall. FIG. 1 illustrates an $SiO_2$ layer 32 overlying silicon semiconductor substrate 30. $SiO_2$ layer 32 may or may not be capped with a diffusion barrier such as $TiO_2$ or $Si_3N_4$. $TiSi_2$/poly-Si plug 34 provides electrical connection through $SiO_2$ layer 32. A 100 nm TiN layer 36 has been reactively sputter deposited and patterned etched on the structure.

Various other standard processes can be used to form this portion structure, such as sputter depositing Ti on poly-Si followed by an $N_2$ rapid thermal anneal (700° C. for 30 seconds) or $NH_3$ furnace anneal (575° C. for 10 minutes). The TiN is then selectively removed chemically using peroxide to form the patterned TiN layer 36 shown. In an alternate method, a vapor HF clean of the underlying poly-Si is performed immediately prior to the deposition of TiN layer 36, without using $TiSi_2$. It is beneficial that the structure not be exposed to a contaiminating environment, such as the atmosphere, between the HF clean and the adhesion layer deposition process steps, in order to ensure good adhesion between the poly-Si and the TiN layer.

A 100 nm Pt layer 38 is then DC sputter deposited in a 5 mTorr Ar atmosphere using a Pt target with the substrate temperature held at 325° C. Pt layer 38 can also be deposited using e-beam evaporation, chemical vapor deposition (CVD), or metal-organic CVD (MOCVD). The height of Pt layer 38 can vary depending on the desired capacitance density of the HDC material, the total desired capacitance, and the generation of the device. For example, future devices such as 1G DRAMs may generally require taller capacitors to provide more electrode surface area/unit area as compared to 256M DRAM devices, since 1G DRAMs will generally need to provide more capacitance/unit area (due to e.g. increased functionality and shrinking device features). After deposition of Pt layer 38, photoresist is deposited and patterned. Platinum layer 38 is then dry etched in a low-pressure, high-density plasma reactive ion etch (RIE) reactor to form the structure shown in FIG. 1.

Figure 2:
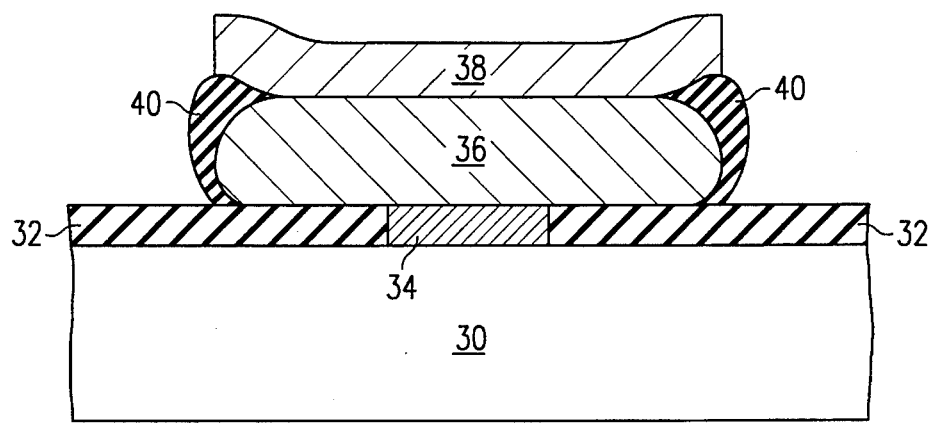

The structure is then annealed in a diluted oxygen (5%$O_2$ in $N_2$) gas at 650° C. to form $TiO_2$ sidewall 40 as shown in FIG. 2. The substantial deformation of the structure, including Pt layer 38, occurs at this point, before deposition of the HDC material. Alternatively, ozone could be used for annealing. Alternatively, the structure could be annealed at a lower temperature (e.g. 600° C.), allowing Pt layer 38 more time to relax than if the oxidation is performed at full BST deposition temperature. Another benefit of this oxidation anneal process is that Pt layer 38 can rearrange to round any relatively sharp corners after being etching, since sharp corner can cause excess leakage current or even cracks.

Figure 3:
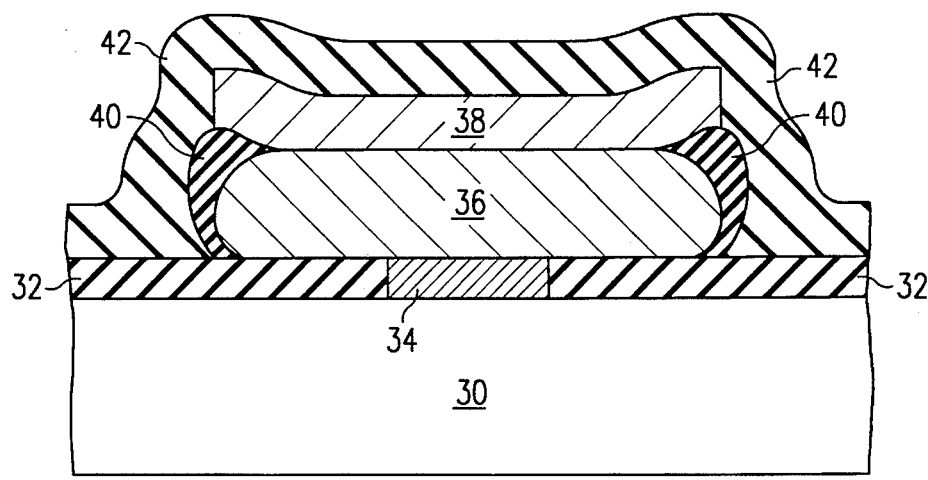

Then BST layer 42 is formed on the electrode structure using metal organic chemical vapor deposition (MOCVD) at 650° C. in an $O_2$/Ar (⅕) mixture gas at a pressure of 10 mTorr, resulting in the structure shown in FIG. 3. Substantial oxidation or expansion of the $TiO_2$ sidewalls does not occur during BST deposition, thus minimizing expansion stress and cracks in BST layer 42. The deposition may used ionic, photonic, electronic or plasma enhancement. BST layer 42 may also be formed by CVD, sputter or spin coat methods.

Figure 4:
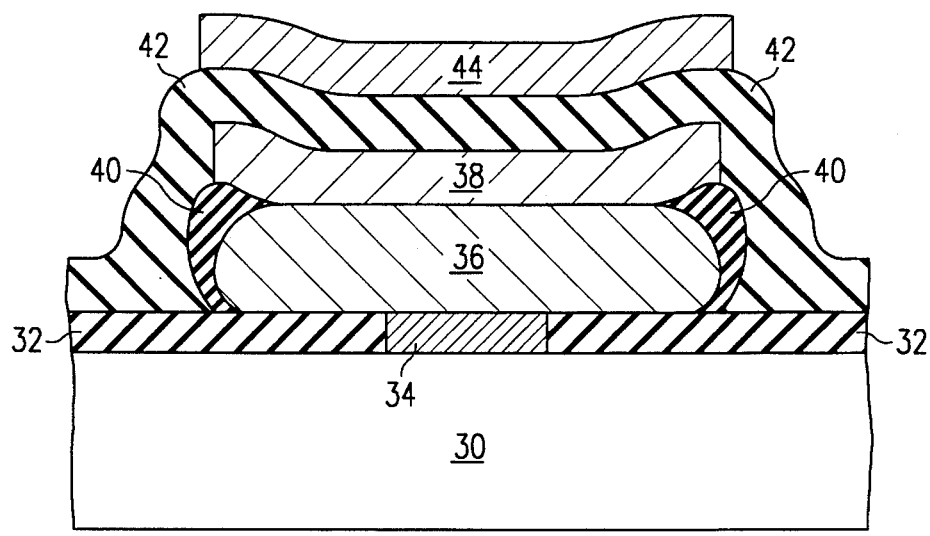

Upper Pt electrode 44 is them sputter deposited and dry etched to form the capacitor structure shown in FIG. 4. This structure, with both lower and upper electrodes, can again be annealed to improve the capacitor properties.

Figure 5:
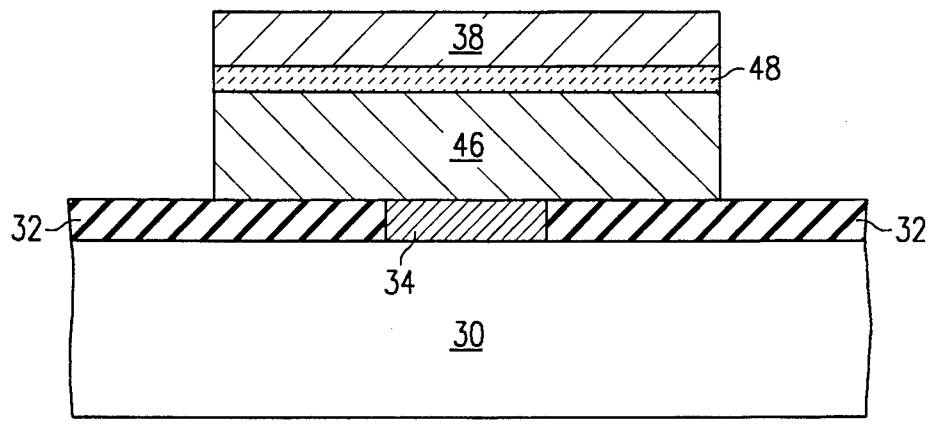
FIGS. 5–8 are cross-sectional views showing the progressive steps in the fabrication of a high-dielectric constant material capacitor with an electrode comprising a conductive, pre-oxidized sidewall.

With reference to FIGS. 5–8, there is shown a method of forming an another embodiment of the present invention, a capacitor with a lower electrode comprising conductive, pre-oxidized sidewalls. The structure illustrated in FIG. 5 is similar to the structure of FIG. 1, except that ruthenium is deposited for adhesion layer 46, instead of TiN. Since Ru has a conductive oxide, the surface of ruthenium layer 46 is oxidized to form $RuO_2$ layer 48, before deposition of Pt layer 38. In this embodiment, current will still be able to flow between substrate 30 and Pt layer 38 even though the top surface of the adhesion layer has been oxidized.

Figure 6:
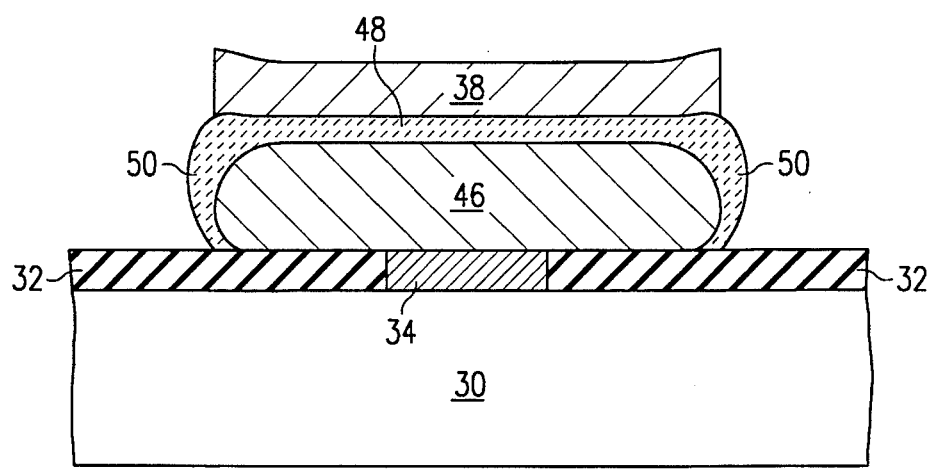

The structure is then annealed in an oxygen containing atmosphere to form $RuO_2$ sidewall 50 as shown in FIG. 6. As with the previous embodiment, the substantial deformation of the structure, including Pt layer 38, occurs at this point, before deposition of the HDC material.

Figure 7:
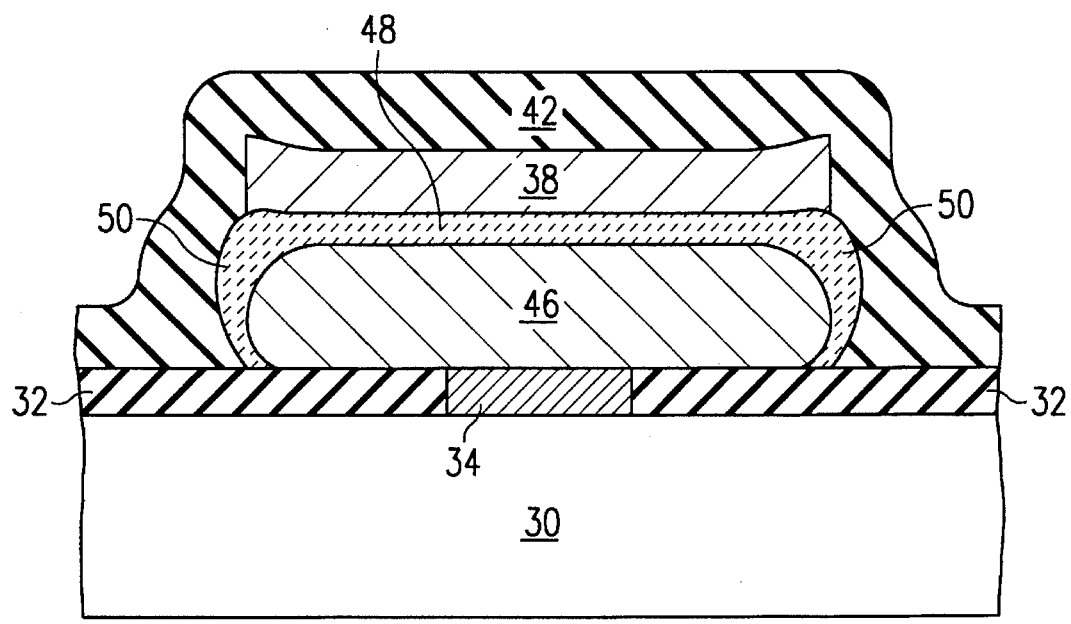

Then BST layer 42 is formed on the electrode structure using MOCVD as described hereinabove, resulting in the structure shown in FIG. 7. Again, substantial oxidation or expansion of the $RuO_2$ sidewalls does not occur during BST deposition, thus minimizing expansion stress and cracks in BST layer 42. Upper Pt electrode 44 is them sputter deposited and dry etched to form the capacitor structure shown in FIG. 8.

Figure 8:
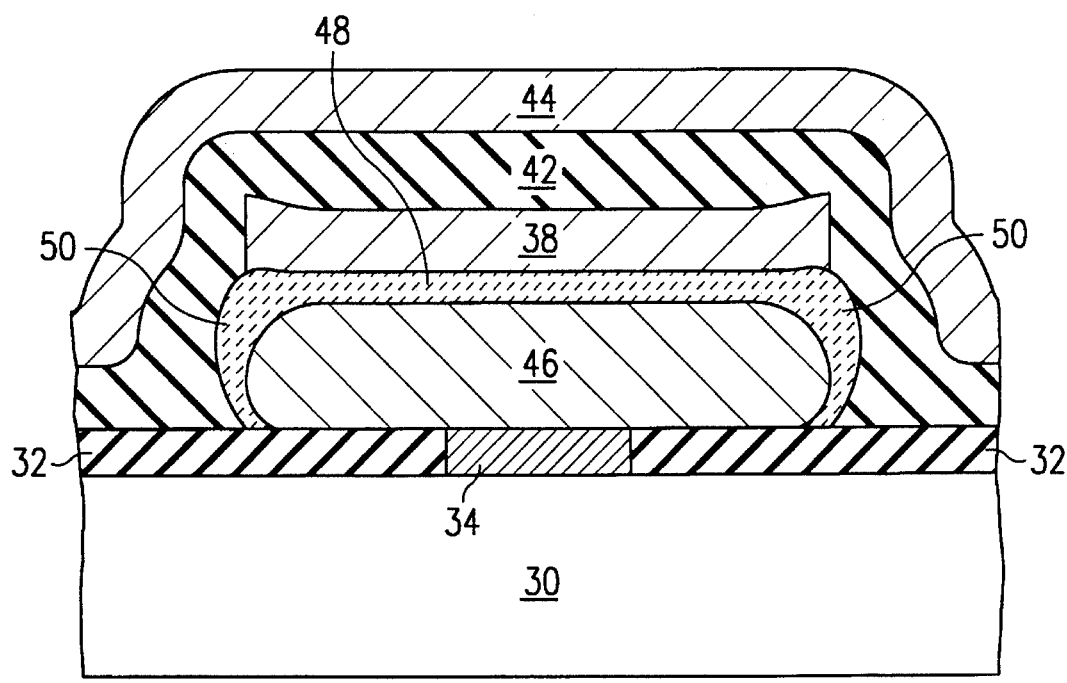

One potential advantage of this embodiment is that the conductive sidewall structure of FIG. 8 generally allows more electrode surface area to be in contact with the HDC material as compared to the non-conductive sidewall structure of FIG. 4.

Another potential advantage of this embodiment is that the top surface of Ru layer 46 is oxidized before the deposition of Pt layer 38, so further oxidation of the top surface of the Ru layer 46/$RuO_2$ layer 48 is minimized. The existing oxide limits the formation of irregular oxidized areas on the top surface of the adhesion layer due to diffusion of oxygen through Pt layer 38 (e.g. along grain boundaries), which can cause hillocking of Pt layer 38.

The sole Table, below, provides an overview of some embodiments and the drawings.

TABLE

| Drawing Element | Preferred or Specific Examples | Generic Term | Other Alternate Examples |
|---|---|---|---|
| 30 | Silicon | Substrate | Other single component semiconductors (e.g. germanium, diamond) Compound semiconductors (e.g. GaAs, InP, Si/Ge, SiC) Ceramic substrates |
| 32 | Silicon | First level | Other insulators |

TABLE-continued

| Drawing Element | Preferred or Specific Examples | Generic Term | Other Alternate Examples |
|---|---|---|---|
| | dioxide | insulator | (e.g. silicon nitride) Doped insulators (e.g. BSG, PSG, BPSG) May be more than one layer (e.g. $Si_3N_4$ barrier over $SiO_2$) May or may not be used (i.e. first level insulator, substrate, another insulating layer or a combination thereof may be the supporting layer for the lower electrode) Combinations of the above materials |
| 34 | $TiSi_2$/ poly-Si | Conductive plug | Other metal compounds (e.g. nitrides: titanium nitride, zirconium nitride; silicides: tantalum silicide, tungsten silicide, molybdenum silicide, nickel silicide; carbides: boron carbide, tantalum carbide; borides: titanium boride) Conductive metals (e.g. tungsten, tantalum, titanium, molybdenum) Single component semiconductors (e.g. single- or poly-crystalline silicon, germanium) Compound semiconductors (e.g. GaAs, InP, Si/Ge, SiC) Other silicides may be used in a composite structure (Ni silicide, Co silicide, tungsten silicide) May be multiple layers (e.g. TiN/$TiSi_x$/poly-Si) Combinations of the above materials |
| 36 | TiN | Adhesion layer | Other conductive metal compounds (e.g. oxides: ruthenium oxide, osmium oxide, rhodium oxide, iridium oxide, indium oxide, tin oxide) Conductive metals (different from specific material selected for drawing element 38 below) (e.g. tungsten, tantalum, titanium, tin, ruthenium, indium, osmium, rhodium, iridium) Ternary (or greater) amorphous nitrides (e.g. Ta—Si—N, Ti—Si—N, Ta—B—N, Ti—B—N) Exotic conductive nitrides (e.g. titanium aluminum nitride, Zr nitride, Hf nitride, Y nitride, Sc nitride, La nitride and other rare earth nitrides, N deficient Al nitride, doped Al nitride, Mg nitride, Ca nitride, Sr nitride, Ba nitride) Alloys of the above exotic conductive nitrides with common Si processing materials such as TiN, GaN, Ni nitride, Co nitride, Ta nitride, W nitride (e.g. Ta—Al—N) Noble metal insulator alloys (e.g. Pd—Si—N, Pt—Si—N, Pd—Si—O, Pd—Si—O, Pd—B—(O,N), Pd—Al—N, Ru—Si—(O,N), Ir—Si—O, Re—Si—N, Rh—Al—O, Au—Si—N, Ag—Si—N) May be multiple layers (e.g. TiN/$TiSi_x$, TiN/$TiSi_x$/poly-Si) May be a layer having relatively better barrier properties over a layer having relatively better adhesive properties (e.g. Ru/TiN) Combinations of the above materials |
| 46 | Ruthenium | | |
| 38 | Platinum | Noble metal layer | Other oxidation resistant noble or platinum group metals (e.g. palladium, iridium, rhodium) Combinations of the above materials Layers of the above materials |
| 40 | $TiO_2$ | Pre-oxidized sidewall | Oxides formed from materials used for drawing elements 36 and 46 above (e.g. tantalum oxide, titanium oxide, tin oxide, indium oxide, iridium oxide, ruthenium oxide) Combinations of the above materials |
| 50 | $RuO_2$ | | |
| 42 | Barium strontium titanate | High-dielectric-constant material layer | Other perovskite, pyroelectric, ferroelectric, or high-dielectric-constant oxides (e.g. $(Ba,Sr,Ca,Pb)(Ti,Zr)O_3$, $(Pb,La)(Zr,Ti)O_3$, bismuth titanate, potassium tantalate, lead scandium tantalate, lead niobate, potassium niobate, lead zinc niobate, lead magnesium niobate, tantalum pentoxide, yttrium oxide) Donor, acceptor, or donor and acceptor doped oxides listed above Combinations of the above materials Layers of the above materials |
| 44 | Platinum | Upper electrode | Conductive metal compounds (e.g. nitrides: titanium nitride, ruthenium nitride, tin nitride, zirconium nitride; oxides: ruthenium dioxide, tin oxide, titanium oxide, TiON, zinc oxide, doped zinc oxide, iridium oxide; silicides: titanium silicide, tantalum silicide, tungsten silicide, molybdenum silicide, nickel silicide; carbides: tantalum carbide; borides: titanium boride) Other noble or platinum group metals |

TABLE-continued

| Drawing Element | Preferred or Specific Examples | Generic Term | Other Alternate Examples |
|---|---|---|---|
| | | | (e.g. palladium, ruthenium, rhodium, gold, iridium, silver) Reactive metals (e.g. tungsten, tantalum, titanium, molybdenum) Other common semiconductor electrodes (e.g. aluminum, doped Si or Ge) Combinations of the above materials May contain more than one layer |
| 48 | RuO$_2$ | Conductive oxide layer | Other conductive oxides (e.g. ruthenium oxide, osmium oxide, rhodium oxide, iridium oxide, tin oxide, indium oxide) Combinations of the above materials |

A few preferred embodiments have been described in detail hereinabove. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits in silicon, germanium, gallium arsenide, or other electronic materials families. In general the preferred or specific examples are preferred over the other alternate examples. The scale of the figures is neither to absolute nor relative scale; some thicknesses have been exaggerated for clarity of explanation. Some components of the lower electrode may sometimes be referred to as being part of the electrode and may sometimes be referred to as being interior to, exterior to, inside of, outside of, on, under, etc. the electrode; the structures and methods of the present invention are substantially the same in either case.

The adhesion layer may comprise other materials than those listed in the table but which are generally less preferred than those materials in the table. For example, the adhesion layer may comprise other metal compounds such as ruthenium nitride, tin nitride, tungsten nitride, tantalum nitride, titanium oxide, TiON, titanium silicide, tantalum silicide, tungsten silicide, molybdenum silicide, nickel silicide, cobalt silicide, iron silicide, chromium silicide, boron carbide, tantalum carbide, titanium carbide, zirconium carbide, titanium boride or zirconium boride. Alternatively, the adhesion layer may comprise other conductive metals (different from the specific material selected for drawing element 38) such as cobalt, iron, chromium, palladium, rhenium, zirconium, hafnium or molybdenum. Alternatively, the adhesion layer may comprise single component semiconductors such as single- or poly-crystalline silicon or germanium, or compound semiconductors such as GaAs, InP, Si/Ge or SiC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectronic structure, said method comprising steps:
    (a) forming a supporting layer having a principal surface;
    (b) forming an adhesion layer on said principal surface of said supporting layer, said adhesion layer comprising a substantially unoxidized sidewall;
    (c) forming a noble metal layer on a top surface of said adhesion layer;
    (d) oxidizing said unoxidized sidewall of said adhesion layer to form a pre-oxidized sidewall; and
    (e) subsequent to oxidizing said sidewall depositing a high-dielectric-constant material layer on said noble metal layer, wherein said pre-oxidized sidewall inhibits further oxidation and expansion of said adhesion layer adjacent said pre-oxidized sidewall during the deposition of the high-dielectric-constant material as compared to oxidation and expansion that would occur in the adhesion layer when the adhesion layer is not oxidized prior to depositing the high-dielectric-constant material.

2. The method according to claim 1, wherein said step (d) of forming said pre-oxidized sidewall deforms a portion of said noble metal layer overlying said pre-oxidized sidewall.

3. The method according to claim 1, said step (e) further comprising depositing said high-dielectric-constant material layer on said pre-oxidized sidewall of said adhesion layer.

4. The method according to claim 1, wherein said pre-oxidized sidewall comprises a conductive oxide.

5. The method according to claim 4, wherein said adhesion layer comprises ruthenium and said pre-oxidized sidewall comprises ruthenium dioxide.

6. The method according to claim 4, said method further comprising oxidizing said top surface of said adhesion layer prior to said step of forming said noble metal layer on said top surface.

7. The method according to claim 6, wherein said adhesion layer comprises ruthenium and said pre-oxidized sidewall comprises ruthenium dioxide.

8. The method according to claim 4, said method further comprising oxidizing said top surface of said adhesion layer during said step of depositing the high-dielectric-constant material layer.

9. The method according to claim 1, said method further comprising forming an upper electrode on said high-dielectric-constant material layer.

10. The method according to claim 9, wherein said upper electrode is selected from the group consisting of: palladium, ruthenium, rhodium, gold, iridium, silver, and combinations thereof.

11. The method according to claim 1, wherein said pre-oxidized sidewall comprises an insulating oxide.

12. The method according to claim 11, wherein said adhesion layer comprises titanium nitride and said insulating oxide comprises titanium dioxide.

13. The method according to claim 1, wherein said adhesion layer is selected from the group of conductive materials consisting of: metals, metal nitrides, metal oxides, metal silicides, metal carbides, metal borides, ternary amorphous nitrides, and combinations thereof.

14. The method according to claim 1, wherein said adhesion layer is selected from the group consisting of: titanium aluminum nitride, Zr nitride, Hf nitride, Y nitride, Sc nitride, La nitride, N deficient Al nitride, doped Al nitride, Mg nitride, Ca nitride, Sr nitride, Ba nitride, and combinations thereof.

15. The method according to claim 1, wherein said high-dielectric-constant material layer is selected from the group consisting off barium strontium titanate, lead zirconate titanate, lead lanthanum titanate, lead lanthanum zirconate titanate, bismuth titanate, potassium tantalate, lead scandium tantalate, lead niobate, lead zinc niobate, potassium niobate, lead magnesium niobate, and combinations thereof.

16. The method according to claim 1, wherein said noble metal layer is selected from the group consisting off platinum, palladium, iridium, rhodium, and combinations thereof.

17. A method of forming a microelectronic structure, said method comprising steps:

(a) forming a supporting layer having a principal surface;

(b) forming a conductive adhesion layer on said principal surface of said supporting layer, said adhesion layer comprising a substantially unoxidized sidewall;

(c) forming a noble metal layer on a top surface of said adhesion layer;

(d) oxidizing said unoxidized sidewall of said adhesion layer to form a conductive preoxidized sidewall; and (e) subsequent to oxidizing said sidewall depositing a high-dielectric-constant material layer on said noble metal layer, wherein said pre-oxidized sidewall inhibits further oxidation and expansion of said adhesion layer adjacent said pre-oxidized sidewall during the deposition of the high-dielectric-constant material as compared to oxidation and expansion that would occur in the adhesion layer when the adhesion layer is not oxidized prior to depositing the high-dielectric-constant material.

18. The method according to claim 17, said method further comprising oxidizing said top surface of said adhesion layer prior to said step of forming said noble metal layer on said top surface.

19. The method according to claim 17, wherein said step (d) of forming said preoxidized sidewall deforms a portion of said noble metal layer overlying said preoxidized sidewall.

20. The method according to claim 17, said step (e) further comprising depositing said high-dielectric-constant material layer on said pre-oxidized sidewall of said adhesion layer.

21. A method of forming a microelectronic capacitor, said method comprising steps:

(a) forming a supporting layer having a principal surface;

(b) forming a ruthenium layer on said principal surface of said supporting layer;

(c) forming a platinum layer on a top surface of said ruthenium layer, said ruthenium layer comprising a substantially unoxidized sidewall;

(d) oxidizing said unoxidized sidewall of said ruthenium layer to form a ruthenium dioxide sidewall;

(e) subsequent to oxidizing said sidewall depositing a barium strontium titanate layer on said platinum layer; and (f) forming an upper electrode on said barium strontium titanate layer.

* * * * *